(12) United States Patent
Zama et al.

(10) Patent No.: US 8,476,534 B2
(45) Date of Patent: Jul. 2, 2013

(54) MULTILAYER PRINTED BOARD AND METHOD FOR MANUFACTURING THE SAME

(75) Inventors: Satoru Zama, Tokyo (JP); Kenichi Ohga, Tokyo (JP); Akira Tachibana, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 240 days.

(21) Appl. No.: 12/810,522

(22) PCT Filed: Dec. 19, 2008

(86) PCT No.: PCT/JP2008/073242
§ 371 (c)(1),
(2), (4) Date: Jun. 25, 2010

(87) PCT Pub. No.: WO2009/081882
PCT Pub. Date: Jul. 2, 2009

(65) Prior Publication Data
US 2010/0276184 A1 Nov. 4, 2010

(30) Foreign Application Priority Data
Dec. 25, 2007 (JP) ................. 2007-333267

(51) Int. Cl.
*H05K 1/14* (2006.01)
*H05K 1/09* (2006.01)
*B32B 37/00* (2006.01)

(52) U.S. Cl.
USPC ........... 174/256; 174/250; 174/255; 174/262; 361/750; 361/751

(58) Field of Classification Search
USPC .......... 361/750, 751; 174/255, 262, 250, 174/256; 156/60, 150; 29/738, 829, 830
See application file for complete search history.

(56) References Cited

U.S. PATENT DOCUMENTS 4,908,940 A * 3/1990 Amano et al. ................. 29/852
4,914,259 A * 4/1990 Kobayashi et al. ........... 174/255

(Continued)

FOREIGN PATENT DOCUMENTS

JP   02132881 A * 5/1990
JP   02254790 A * 10/1990

(Continued)

OTHER PUBLICATIONS

Notice for a Reason of Rejection issued Jun. 8, 2012 in Japanese Patent Application No. 2007-333267 (with English translation).

*Primary Examiner* — Anatoly Vortman
(74) *Attorney, Agent, or Firm* — Oblon, Spivak, McClelland, Maier & Neustadt, L.L.P.

(57) ABSTRACT

Provided is a multilayer printed board 10 having three single-sided conductor pattern films 16 each having a conductor pattern 13 formed on one surface of a resin film 12 having a through hole 11 and a filled through hole 15 that is the through hole 11 filled with a conductor 14 integrally with the conductor pattern 13. These single-sided conductor pattern films 16 are stacked in such a manner that their tops are oriented in the same way. The conductor patterns 13 of the single-sided conductor pattern films 16 are electrically connected via the filled through holes 15. As the conductor patterns 13 of the single-sided conductor pattern films 16 are interlayer connected via the filled through holes 15, the interlayer connection reliability can be enhanced.

8 Claims, 7 Drawing Sheets

U.S. PATENT DOCUMENTS

| | | | |
|---|---|---|---|
| 5,223,676 A * | 6/1993 | Yamamoto et al. | 174/250 |
| 5,744,758 A * | 4/1998 | Takenouchi et al. | 174/255 |
| 5,939,789 A | 8/1999 | Kawai et al. | |
| 6,228,467 B1 | 5/2001 | Taniguchi et al. | |
| 6,667,443 B2 | 12/2003 | Kondo et al. | |
| 2001/0005545 A1* | 6/2001 | Andou et al. | 428/209 |
| 2001/0023532 A1* | 9/2001 | Fujii et al. | 29/830 |
| 2002/0015293 A1* | 2/2002 | Akiba et al. | 361/793 |
| 2003/0007330 A1* | 1/2003 | Kondo | 361/748 |
| 2004/0104042 A1* | 6/2004 | Takase et al. | 174/255 |
| 2007/0176613 A1* | 8/2007 | Ogawa et al. | 324/754 |
| 2009/0217518 A1* | 9/2009 | Hiroshi et al. | 29/832 |
| 2010/0195954 A1* | 8/2010 | Asai et al. | 385/14 |
| 2010/0224395 A1* | 9/2010 | Higashitani | 174/258 |

FOREIGN PATENT DOCUMENTS

| | | | |
|---|---|---|---|
| JP | 04017385 A * | 1/1992 | |
| JP | 04094186 A * | 3/1992 | |
| JP | 7 240582 | 9/1995 | |
| JP | 2000 38464 | 2/2000 | |
| JP | 2003 86948 | 3/2003 | |
| JP | 2003 309214 | 10/2003 | |
| JP | 2003-324280 | 11/2003 | |
| JP | 2006 179827 | 7/2006 | |
| JP | 2009130049 A * | 6/2009 | |

* cited by examiner

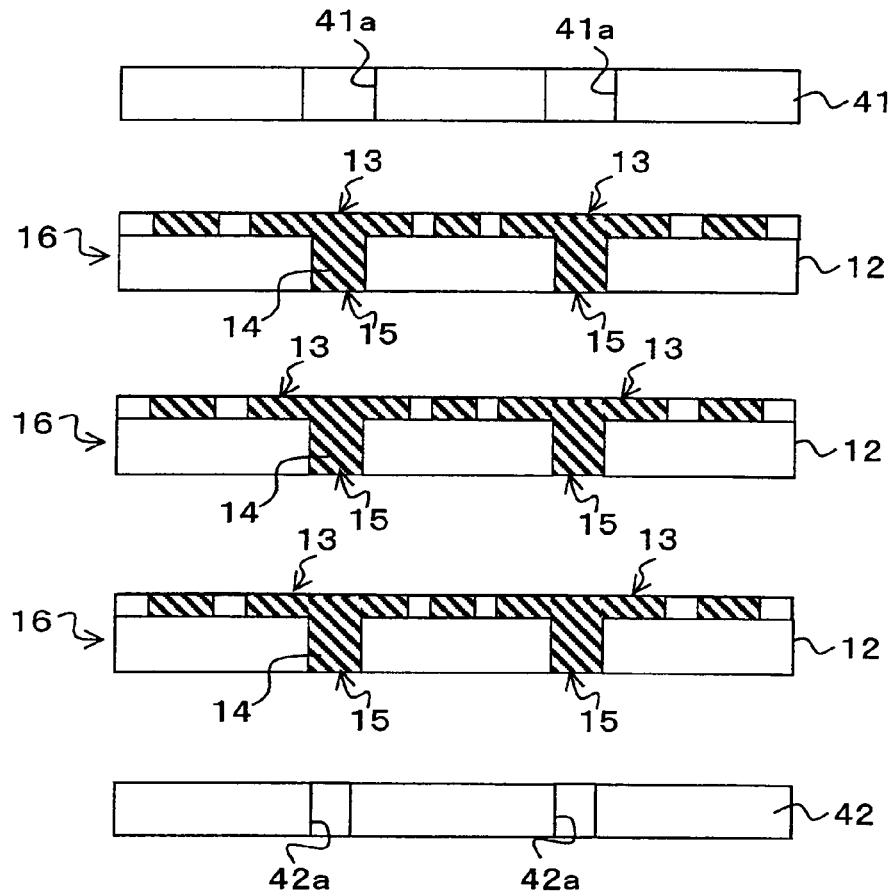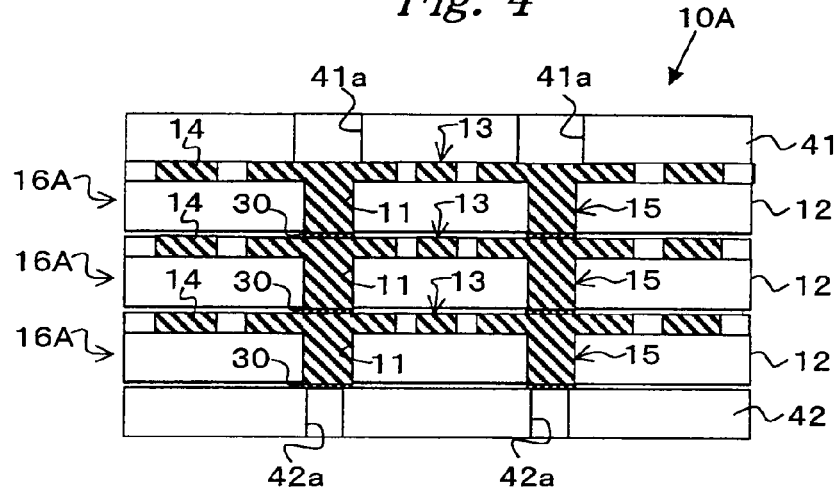

MULTILAYER PRINTED BOARD AND METHOD FOR MANUFACTURING THE SAME

TECHNICAL FIELD

The present invention relates to a multilayer printed board and a method for manufacturing the same.

BACKGROUND ART

Conventionally, as the method for manufacturing a multilayer printed board, for example, the patent documents 1 and 2 disclose a method for manufacturing a multilayer board.

The patent document 1 discloses a method for manufacturing a multilayer board having electrodes on both sides of the board by manufacturing a plurality of interlayer connected double-sided boards and stacking these double-sided boards via a film insulator that is processed to be capable of interlayer connection.

The patent document 2 discloses a method for manufacturing a multilayer board having electrodes on both sides by depositing a single-sided conductor pattern film that is a resin film with a conductor pattern on a single side thereof and removing the resin film to expose the electrodes. The patent document 2 also discloses a technique of removing a single-sided conductor pattern film that is a multilayer board surface, forming a bottomed via hole with the conductor pattern as a bottom surface and filling the bottomed via hole with a conductive paste thereby to achieve conduction of conductor patterns of such single-sided conductor pattern films adjacent to each other via this conductive paste. This structure makes it possible to bring the conductor pattern layers of the multilayer board into conduction via the conductive paste in the via holes.

Patent document 1: Japanese Patent Application Laid-Open No. 2000-38464 (Patent No. 3355142)

Patent document 2: Japanese Patent Application Laid-Open No. 2003-86948 (Patent No. 3407737)

DISCLOSURE OF THE INVENTION

Problems to be Solved by the Invention

Meanwhile, in the related art disclosed in the above-mentioned patent document 1, out of a plurality of resin films with conductor patterns formed on both sides thereof, one different resin film is interposed between two resin films adjacent to each other. In the related art disclosed in the above-mentioned patent document 2, one resin film is interposed between two adjacent resin films out of a plurality of resin films having a conductor pattern formed on one side thereof. These structures need many components and the manufacturing cost becomes high.

In addition, in fusion press, the different resin film between adjacent two resin films is likely to be deformed and therefore, it is hard to connect all the layers electrically and the interlayer connection reliability is low. Particularly, when thermoplastic resin is used in the resin films, the resin films are likely to be deformed in fusion press and there are outstanding defects of variations in thickness of the multilayer substrate.

The present invention was carried out in view of the problems of the related art and has an object to provide a multilayer printed board and a method for manufacturing the same, the multi-layer printed board having fewer components thereby to achieve reduction in manufacturing cost and also having highly reliable interlayer connection.

Means for Solving the Problem

In order to solve the above-mentioned problems, an aspect of the invention is a multilayer printed board comprising a plurality of single-sided conductor pattern films, each of the single-sided conductor pattern films having a conductor pattern formed on one surface of a resin film having a through hole and a filled through hole that is the through hole filled with a conductor integrally with the conductor pattern, the single-sided conductor pattern films being stacked one on another in such a manner that respective tops of the single-sided conductor pattern films are oriented in a same manner, and conductor patterns of the single-sided conductor pattern films being electrically connected to each other via filled through holes.

According to this structure, as the conductor patterns of the single-sided conductor pattern films are interlayer connected via the filled through holes that are through holes filled with conductors integrally with the conductor patterns, the interlayer connection reliability is enhanced. In other words, as the conductor patterns and filled through holes of the single-sided conductor pattern films are formed simultaneously and of the same conductors, the interlayer connection reliability is enhanced. In addition, as no another resin film is interposed between the single-sided conductor pattern films, the number of components and the manufacturing cost can be reduced. Further, as in superposing of the single-sided conductor pattern films by heat fusion press, the filled through holes of the single-sided conductor pattern films serve as support in the thickness direction, it becomes possible to reduce variations of the thickness in heat fusion press.

The multilayer printed board according to an aspect of the invention is characterized by further comprising a conductive member provided between the conductor pattern and the filled through hole that oppose between each adjacent two of the single-sided conductor pattern films, the conductive member being metal-to-metal connected to the conductor pattern and the filled through hole.

According to this structure, as opposing conductor pattern and filled through hole is mechanically bonded and electrically connected via the conductive member between adjacent two single-sided conductor pattern films of the plural single-sided conductor pattern films, the interlayer connection reliability and reliability are enhanced.

The multilayer printed board according to an aspect of the invention is characterized in that the conductive member is metal containing Sn.

The multilayer printed board according to an aspect of the invention is characterized in that the metal containing Sn contains, in addition to Sn, at least one of Ag, Cu, Zn and Bi.

The multilayer printed board according to an aspect of the invention is characterized in that the conductor pattern and the filled through hole have a base metal layer and a conductor formed on the base metal layer, the conductor pattern being formed in the conductor.

According to this structure, as the conductor is formed on the base metal layer, the thickness of conductor of the conductor pattern can be thinner and even. Besides, as the conductor pattern and the filled through hole have a 2-layer structure having the base metal layer and conductor, adhesion of the conductors of the filled through hole and the conductor pattern to the resin films is improved and the interlayer connection reliability is more enhanced.

The multilayer printed board according to an aspect of the invention is characterized in that the base metal layer is made of Ni-P alloy containing P at 2 to 6% and having a thickness of 0.05 to 0.5 micrometers and the conductor is made of Cu.

The multilayer printed board according to an aspect of the invention is characterized in that a land part of each of the filled through holes is enlarged.

According to this structure, as the area where the opposing conductor pattern and filled through hole are connected directly or via the conductive member between adjacent two single-sided conductor pattern films out of the plural single-sided conductor pattern films is enlarged, the interlayer connection reliability is more enhanced.

The multilayer printed board according to an aspect of the invention is characterized by further comprising a double-sided conductor pattern film having conductor patterns formed on both surfaces, respectively, of a resin film having a through hole and a filled through hole that is the through hole filled with a conductor integrally with the conductor patterns, the double-sided conductor pattern film being stacked on an outermost one of the single-sided conductor pattern films, one of the conductor patterns of the double-sided conductor pattern film is electrically connected to the filled through hole of the outermost single-sided conductor pattern film directly or via the conductive member metal-to-metal connected to one of the conductor patterns and the filled through hole.

According to this structure, as the double-sided conductor pattern film having conductor patterns on both surfaces thereof is arranged at the outermost side, electrical connection to the outside is facilitated and the design flexibility is increased.

The multilayer printed board according to an aspect of the invention is characterized in that the resin film is a thermoplastic resin having a glass transition point and a fusing point between or equal to 150 and 350 ° C.

The multilayer printed board according to an aspect of the invention is characterized in the resin film is a film of which crystal is optically anisotropic.

The multilayer printed board according to an aspect of the invention is characterized in that the resin film comprises polyaryl ketone and amorphous polyetherimide.

A further aspect of the invention provides a method for manufacturing a multilayer printed board comprising the steps of: manufacturing a plurality of single-sided conductor pattern films, each of the single-sided conductor pattern films having a conductor pattern formed on one surface of a resin film having a through hole and a filled through hole that is the through hole filled with a conductor integrally with the conductor pattern; and stacking the single-sided conductor pattern films in such a manner that respective tops of the single-sided conductor pattern films are oriented in a same way and the conductor pattern and the filled through hole of adjacent two of the single-sided conductor pattern films are in contact with each other, and superposing the single-sided conductor pattern films by heat fusion press.

According to this structure, as the conductor patterns of the plural single-sided conductor pattern films are interlayer connected via the filled through holes that are the through holes filled with conductors integrally with the conductor patterns, the interlayer connection reliability is enhanced. In other words, as the conductor patterns and filled through holes of the single-sided conductor pattern films are formed simultaneously and of the same conductors, the interlayer connection reliability is enhanced.

Further, as no another resin film is interposed between the single-sided conductor pattern films, the number of components and the manufacturing cost can be reduced. Further, as in superposing of the single-sided conductor pattern films by heat fusion press, the filled through holes of the single-sided conductor pattern films serve as support in the thickness direction, it becomes possible to reduce variations of the thickness in heat fusion press.

Another aspect of the invention provides a method for manufacturing a multilayer printed board comprising the steps of: manufacturing a plurality of single-sided conductor pattern films, each of the single-sided conductor pattern films having a conductor pattern formed on one surface of a resin film having a through hole and a filled through hole that is the through hole filled with a conductor integrally with the conductor pattern; plating at least one of a part of a surface of the conductor pattern and a surface of a land part of the filled through hole with Sn thereby to form a plated layer; and stacking the single-sided conductor pattern films in such a manner that respective tops of the single-sided conductor pattern films are oriented in a same way and superposing the single-sided conductor pattern films by heat fusion press.

According to this structure, Sn of the plated layer (Sn plated layer) formed by Sn containing plating of at least one of the land part surface of the filled through hole and a part of the conductor pattern surface of the single-sided conductor pattern film is melt in heat fusion press and formed into the conductive member metal-to-metal connected to the land part surface of the filled through hole and the part of the conductor pattern surface. Accordingly, as the opposing conductor pattern and the filled through hole between adjacent two single-sided conductor pattern films are mechanically bonded and electrically connected to each other via the conductive member, the interlayer connection reliability is enhanced.

The method for manufacturing the multilayer printed board according to an aspect of the invention is characterized in that the plating containing Sn is electroplating or displacement plating.

An additional aspect of the invention provides a method for manufacturing a multilayer printed board comprising the steps of: manufacturing a plurality of single-sided conductor pattern films, each of the single-sided conductor pattern films having a conductor pattern formed on one surface of a resin film having a through hole and a filled through hole that is the through hole filled with a conductor integrally with the conductor pattern; and interposing conductive paste or metal powders between a part of a surface of the conductor pattern and a surface of a land part of the filled through hole, stacking the single-sided conductor pattern films in such a manner that tops of the single-sided conductor pattern film are oriented in a same way and superposing the films by heat fusion press.

The method for manufacturing the multilayer printed board according to an aspect of the invention is characterized in that in the step of superposing by heat fusion press, a double-sided conductor pattern film having conductor patterns formed on both surfaces, respectively, of a resin film having a through hole and a filled through hole that is the through hole filled with a conductor integrally with the conductor patterns is stacked on an outermost one of the single-sided conductor pattern films.

According to this structure, as the double-sided conductor pattern film having conductor patterns on both surfaces thereof is arranged at the outermost side, electrical connection to the outside is facilitated and the design flexibility is increased.

The method for manufacturing the multilayer printed board according to an aspect of the invention is characterized in that in the step of manufacturing of the single-sided conductor pattern films, a base metal layer is formed on an inner wall of the through hole and on a surface of the resin film by electroless plating, a conductor is formed on the base metal layer by electroplating, the conductor formed on one of surfaces of the resin film where the conductor pattern is not formed is removed except in a land part of the filled through hole, and the conductor pattern is formed in the conductor formed on an opposite surface of the resin film.

According to this structure, as the conductor pattern and the filled through hole have a 2-layer structure having the base metal layer and conductor, adhesion of the conductor is improved. Accordingly, the interlayer connection reliability is enhanced. In addition, as the base metal layer is formed by electroless plating, the conductor of the conductive pattern can be thinner and have even thickness. Accordingly, the finer conductor pattern can be formed. Meanwhile, in the related arts disclosed in the patent documents 1 and 2, as the conductor pattern is formed after fusion press of a copper foil on the film, there is restriction as to the thickness of the copper foil and it is not suitable for microfabrication.

The method for manufacturing the multilayer printed board according to an aspect of the invention is characterized in that in forming of the conductor on the base metal layer by electroplating, the conductor formed on the one surface of the resin film where the conductor pattern is not formed is made thinner than the conductor pattern formed on the opposite surface of the resin film.

According to this structure, the conductor formed on the one surface where the conductor pattern is not formed can be easily removed except in the land part of the filled through hole, and the operation time can be shortened.

The method for manufacturing the multilayer printed board according to an aspect of the invention is characterized in that the conductive paste comprises metal powders containing at least Sn, Cu and Ag.

Effect of the Invention

According to the present invention, it is possible to obtain a multilayer printed board that has fewer components thereby to reduce the manufacturing cost and having highly reliable interlayer connection.

BRIEF DESCRIPTION OF THE DRAWINGS

FIG. 3 is an explanatory view illustrating arrangement of components that are stacked to be subjected to batch heat fusion press in the first embodiment;

FIG. 4 is a cross sectional view illustrating an outline structure of a part of a multilayer printed board according to a second embodiment;

Figure 1:
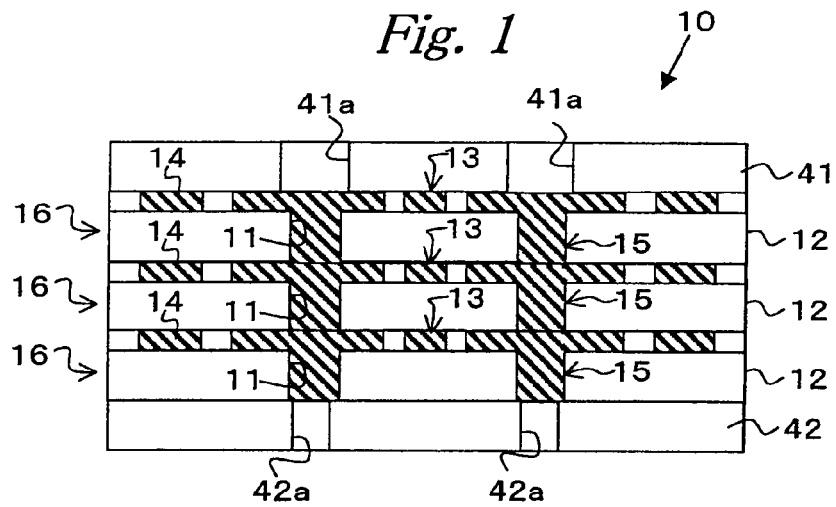
FIG. 1 is a cross sectional view illustrating the outline structure of a part of a multilayer printed board according to a first embodiment.

REFERENCE NUMERALS 10, 10A, 10B, 10C, 10D: multilayer printed board
11, 21: through hole
12, 22: resin film
13, 23: conductor pattern
14, 24: conductor
14a: conductor formed on one surface of resin film
14b: conductor formed on an opposite surface of resin film
15: filled through hole
16, 16A, 16B, 16C: single-sided conductor pattern film
17: base metal layer
26: double-sided conductor pattern film
30, 32: conductive member
30A, 31a: plated layer of Sn or Sn alloy
32A: conductive paste
41, 42: resist film
41a, 42a: through hole

BEST MODE FOR CARRYING OUT THE INVENTION

With reference to the drawings, embodiments of the present invention will be described below. In explanation of each of the embodiment, like parts are denoted by like reference numerals and thereby overlapping description is omitted.

(First Embodiment)

A multilayer printed board according to the first embodiment is described with reference to FIGS. 1 to 3.

FIG. 1 is a cross sectional view illustrating an outline structure of a part of the multilayer printed board according to the first embodiment, FIGS. 2(A) to 2(F) are process charts illustrating the process of manufacturing a single-sided conductor pattern film used in the multilayer printed board, and FIG. 3 is an explanatory view illustrating arrangement of components of the multilayer printed board that are stacked and subjected to batch heat fusion press.

The multilayer printed board 10 illustrated in FIG. 1 is, for example, formed of three layers.

This multilayer printed board 10 has three single-sided conductor pattern films 16 each having a conductor pattern 13 formed on a single side of a resin film 12 with a through hole 11 and a filled through hole 15 that is the through hole 11 filled with a conductor 14 integrally with a conductor pattern 13. These three single-sided conductor pattern films 16 are stacked with their tops oriented in the same way.

Besides, in the multilayer printed board 10, the conductor patterns 13 of the three single-sided conductor pattern films 16 are electrically connected via the filled through holes 15.

Further, the multilayer printed board 10 has a resist film 41 entirely covering one-side conductor pattern 13 of the single-sided conductor pattern films 16 and a resist film 42 entirely covering the other surface. The resist film 41 has through holes 41a for exposing apart of the conductor pattern (part serving as an electrode) and the resist film 42 has through holes 42a for exposing the filled through holes 15.

The resin films 12 of the single-sided conductor pattern films 16 are made of the same film base material. The film base material may be usually glass fabric base material epoxy resin, BT resin or the like, however, in consideration of bonding of plural layers by heat fusion press, the film base material is preferably thermoplastic resin. The thermoplastic film includes PEEK (Polyetheretherketone), PES (Polyethersulfone), PPE (Polyphenyeneether) and PTFE (Polytetrafluoroethylene). Besides, it may be thermoplastic polyimide.

In each single-sided conductor pattern film 16, the conductor pattern 13 and the filled through hole 15 have a base metal layer 17 (see FIG. 2(C)) and a conductor 14 formed on the base metal layer 14, and the conductor pattern 13 is formed in the conductor 14.

The multilayer printed board 10 having the above-described structure is manufactured by stacking the three single-sided conductor pattern films 16 with their tops oriented in the same way as illustrated in FIG. 1, arranging the resist films 41 and 42 on the respective sides of the single-sided conductor pattern films 16 and performing batch heat fusion press thereon. With this heat fusion press, each adjacent ones of the three single-sided conductor pattern films 16 and resist films 41 and 42 are fused to each other, and between adjacent two single-sided conductor pattern films 16 of the three single-sided conductor pattern films 16, opposing conductor patterns 13 and filled three holes 15 are electrically connected to each other. With this structure, the respective conductor patterns 13 of the three single-sided conductor pattern films 16 are interlayer-connected via the filled through holes 15.

Figure 2:
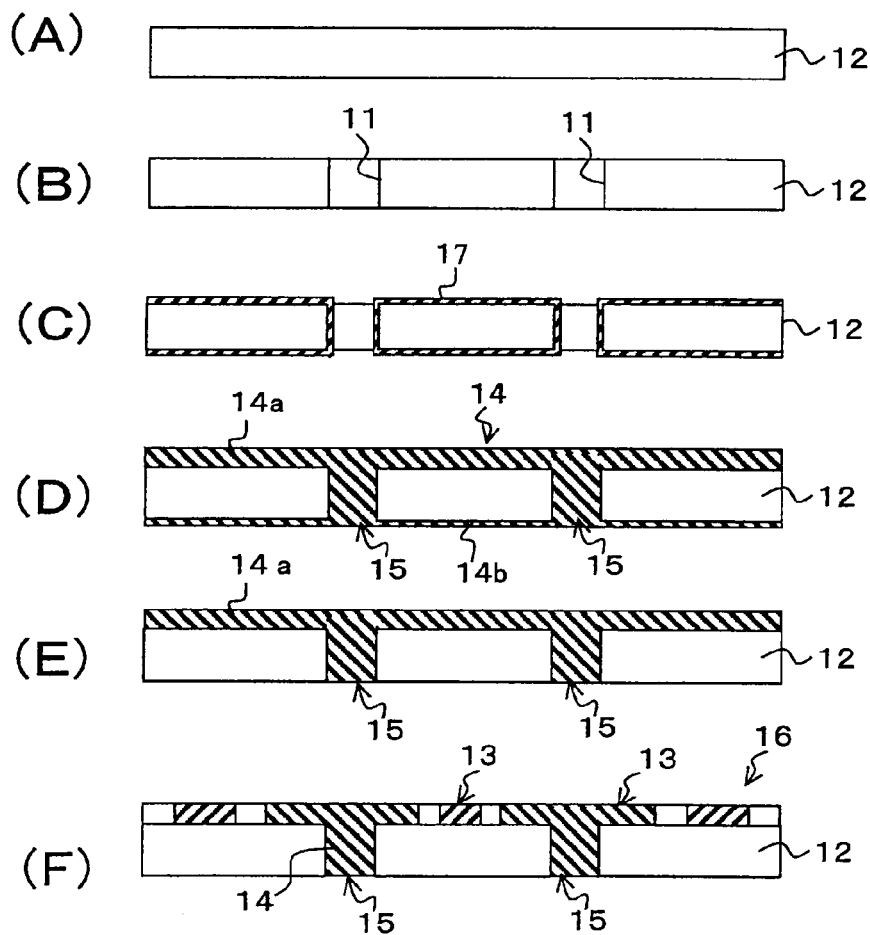
FIGS. 2(A) to 2(F) are process charts illustrating the process of manufacturing a single-side conductor pattern film used in the multilayer printed board according to the first embodiment.

Next description is made, with reference to FIGS. 2 and 3, about a method for manufacturing of the multilayer printed board 10 of the above-described structure.

(1) First performed is a process of manufacturing a single-sided conductor pattern film 16 having a conductor pattern 13 formed on one surface of a resin film 12 having through holes 11 and filled through holes 15 that are the through holes 11 filled with conductors 14 integrally with the conductor pattern 13.

In this step, first, the through holes 11 are formed in the resin film 12 illustrated in FIG. 2(A) by hole forming (see FIG. 2(B)).

Next, resin smear created in forming of the through holes 11 is melt and removed, and the inner wall surfaces of the through holes 11 are roughened.

Then, as illustrated in FIG. 2(C), on the inner walls of the through holes 111 and both surfaces of the resin film 12, base metal layers 17 are formed. The base metal layers 17 are formed by electroless plating.

Next, on the base metal layers 17, a conductor 14 is formed by electroplating (see FIG. 2(D)). Here, the conductor 14 formed on the both surfaces of the resin film 12 has a conductor 14b formed on one surface of the resin film 12 where the conductor pattern 13 is not formed and a conductor 14a formed on the other surface of the resin film 12, the conductor 14b being thinner than the conductor 14a.

Then, out of the both surfaces of the resin film 12, the conductor formed on one surface of the resin film 12 where the conductor pattern 13 is not formed is removed except in land parts of the filled through holes 15 (see FIG. 2(E)).

Next, the conductor pattern is formed on the conductor 14 (conductor 14a) on the one surface of the resin film (see FIG. 2(F)).

(2) Then, three (or plural) single-sided conductor pattern films 16 are stacked in such a manner that their tops are oriented in the same way and between adjacent two single-sided conductor pattern films, the land parts of the filled through holes 15 and the conductor pattern 13 are in contact with each other. These stacked layers are subjected to batch heat fusion press thereby to finish the stacking step.

In this step, the resist films 42, the three single-sided conductor pattern films 16 and the resist film 41 are stacked in the order illustrated in FIG. 3 and these stacked layers are subjected to batch heat fusion press to be superposed. Through this step, the multilayer printed board 10 illustrated in FIG. 1 is obtained.

The thus-structured first embodiment exerts the following effects.

As the conductor patterns 13 of the respective single-sided conductor pattern films 16 are interlayer-connected via the filled through holes 15 that are through holes 11 filled with the conductors 14 integrally with the conductor patterns 13, the interlayer connection reliability is enhanced. In other words, as the conductor patterns 13 of the single-sided conductor pattern films 16 and the filled through holes 15 are formed simultaneously and of the same conductors 14, the interlayer connection reliability is enhanced.

In addition, as no different film is interposed between the single-sided conductor pattern films 16, the number of components is reduced thereby to achieve reduction of the manufacturing cost.

Further, when the plural single-sided conductor pattern films are superposed by batch heat fusion press, the filled through holes of each of the single-sided conductor pattern films serve as support columns in the thickness direction, and thereby, it is possible to prevent the thickness from varying in heat fusion press.

Therefore, it is possible to obtain the multilayer printed board that has fewer components to reduce the manufacturing cost and highly reliable interlayer connection.

As the conductor 14 illustrated in FIG. 2(D) is formed on the base metal layers 17 illustrated in FIG. 2(C), the conductor pattern 13 (see FIG. 2(F)) can be thinner in conductor and even.

As the conductor pattern 13 and the filled through holes 15 are formed into a two-layer structure having the base metal layers 17 and the conductor 14, the conductors 14 of the filled through holes 15 and the conductor pattern 13 are in excellent contact with the resin film 12, and therefore, the interlayer connection reliability is further enhanced.

As the base metal layers 17 are formed by electroless plating, the filled through holes 15 and the conductor pattern 13 can be made thinner. This makes it possible to make the conductor pattern 13 finer.

As the conductor pattern 13 and the filled through holes 15 are formed simultaneously, the connection reliability is enhanced and the conductor pattern 13 and the filled through holes 15 are equal in conductor thickness.

In the conductor 14 formed on both sides of the resin film 12, the conductor 14b formed on one surface of the resin film 12 where the conductor pattern 13 is not formed is thinner than the conductor 14a formed on the other surface of the resin film 12. Therefore, the conductor 14b formed on one surface of the resin film where the conductor pattern 13 is not formed can be easily removed except in the land parts of the filled through holes 15 and the working time can be shortened.

(Second Embodiment)

Figure 5:
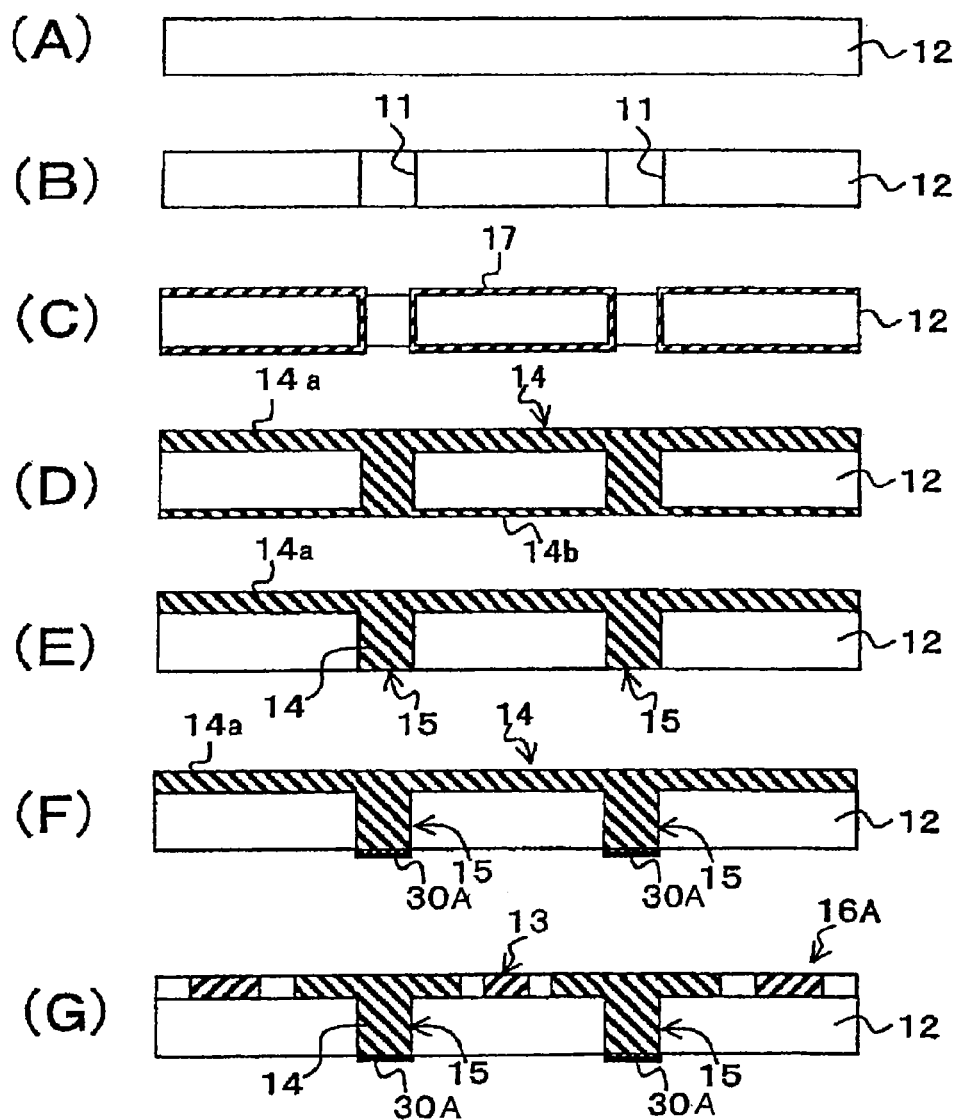
FIGS. 5(A) to 5(G) are process charts illustrating the process of manufacturing a single-sided conductor pattern film used in the multilayer printed board according to the second embodiment.
Figure 6:
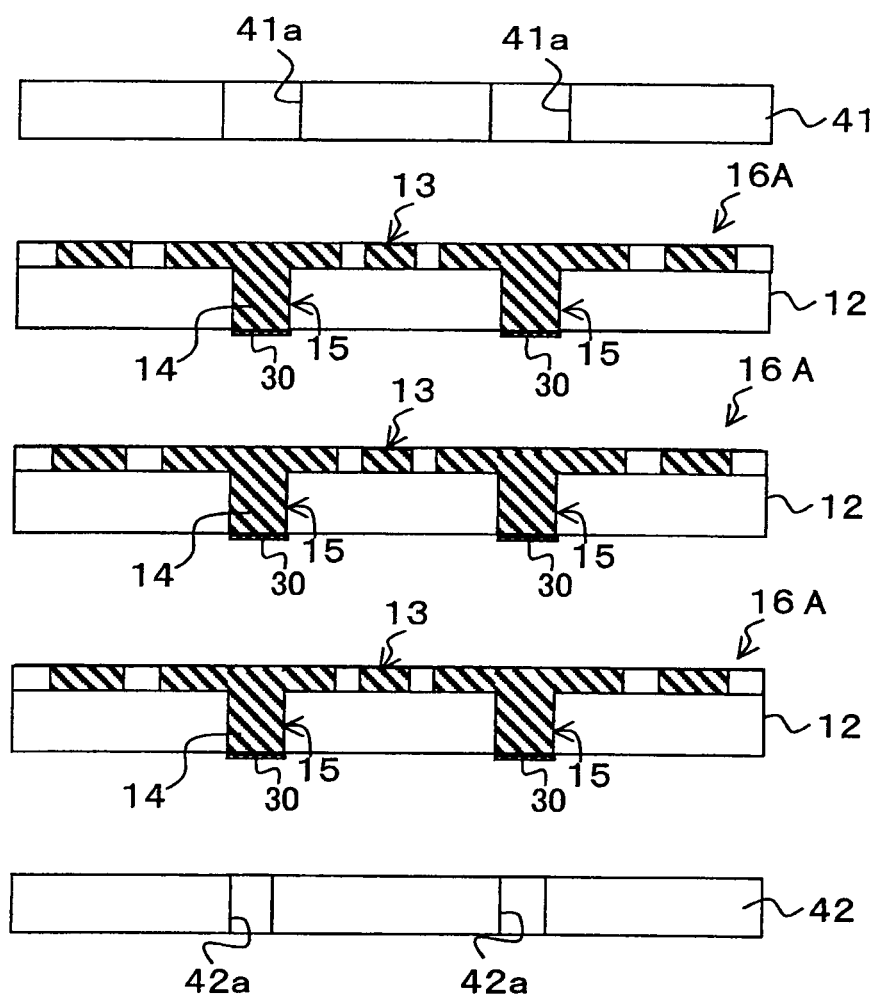
FIG. 6 is an explanatory view illustrating arrangement of components that are stacked to be subjected to batch heat fusion press in the second embodiment.

Next description is made about a multilayer printed board 10A according to the second embodiment, with reference to FIGS. 4 to 6. FIG. 4 is a cross sectional view illustrating an outline structure of a part of the multilayer printed board 10A according to the second embodiment, FIGS. 5(A) to 5(G) are process charts illustrating the process of manufacturing a single-sided conductor pattern film 16A used in the multilayer printed board 10A, and FIG. 6 is an explanatory view illustrating arrangement of components of the multilayer printed board 10A that are stacked and subjected to batch heat fusion press.

The multilayer printed board 10A is characterized in that, as illustrated in FIG. 4, a conductive member 30 is further comprised, in the above-described first embodiment, between the conductor pattern 13 and the filled through holes 15 between adjacent two single-sided conductor pattern films 16A, 16A out of plural single-sided conductor pattern films 16A, the conductive member 30 being metal-to-metal connected to the conductor pattern 13 and the filled through holes 15. The other structure of the multilayer printed board 10A is the same as that of the multilayer printed board 10 in the above-described first embodiment.

The single-sided conductor pattern film 16A is manufactured at the steps illustrated in FIGS. 5(A) to 5(G). FIGS. 5(A) to 5(E) are the same as FIGS. 2(A) to 2(E) and descriptions thereof are omitted here.

After the step illustrated in FIG. 5(E), the plated layer 30A of Sn or Sn alloy is formed on the land part surfaces of the filled through holes 15 by electroplating or displacement plating (see FIG. 5(F)). This plating layer 30A is not limited to the structure having only Sn, but may include the structure containing, in addition to Sn, a Sn alloy containing at least one of Ag, Cu, Zn and Bi.

Then, on the conductor 14 (conductor 14a) formed on the single surface of the resin film 12, a conductor pattern 13 is formed (see FIG. 5(G)).

After this, three (or plural) single-sided conductor pattern films 16A are stacked in such a manner that their tops are oriented in the same way and the conductor pattern 13 and the land parts of the filled through holes 15 are in contact with each other between adjacent two single-sided conductor pattern films 16A. Then, these stacked layers are subjected to batch heat fusion press to be superposed.

In this step, the resist film 42, the three single-sided conductor pattern films 16A and the resist film 41 are stacked in the order illustrated in FIG. 6 and superposed by batch heat fusion press. With this structure, the multilayer printed board illustrated in FIG. 4 is achieved.

The thus-structured second embodiment exerts the following effects as well as the above-mentioned effects of the first embodiment.

As the conductor patterns 13 of the three single-sided conductor pattern films 16A are interlayer connected via the conductive members 30 and the filled through holes 15, that is, as interlayer connection is performed with the conductive members 30 formed by melting Sn of the plated layer of Sn or Sn alloy, the interlayer connection reliability is enhanced more than the interlayer connection using the conductive paste.

(Third Embodiment)

Next description is made about a multilayer printed board according to the third embodiment, with reference to FIGS. 7(A) to 7(D). FIGS. 7(A) to 7(D) are process charts illustrating the process of manufacturing a single-sided conductor pattern film 16B in the multilayer printed board according to the third embodiment.

Figure 7:
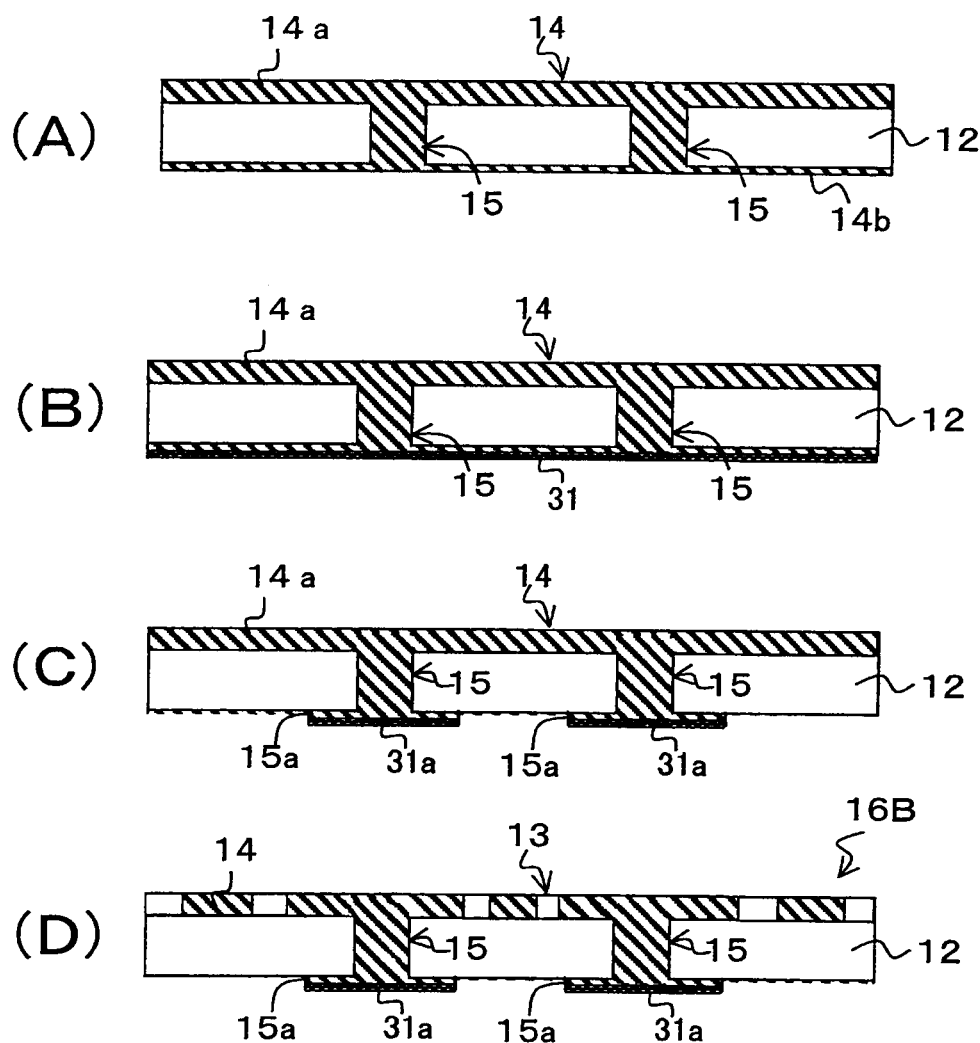
FIGS. 7(A) to 7(D) are process charts illustrating the process of manufacturing a single-side conductor pattern film used in a multilayer printed board according to a third embodiment.

The multilayer printed board according to the third embodiment is such a multilayer printed board as obtained by improving the multilayer printed board 10A according to the second embodiment and is characterized in that the land parts 15a (see FIG. 7(B)) of the filled through holes 15 of the plural single-sided conductor pattern films 16B and the plated layers 31a of Sn or Sn alloy are enlarged.

Each single-sided conductor pattern film 16B has the same structure as the single-sided conductor pattern film 16A of the above-described second embodiment illustrated in FIGS. 4 to 6 except for the enlarged land parts 15a. Besides, conductive members (not shown) obtained by melting Sn of the plated layers 31a of Sn or Sn alloy have the same structure as the conductive member 30 except that they are larger than the conductive member 30 of the multilayer printed board 10A according to the above-described second embodiment. Further, the other structure of the multilayer printed board according to the third embodiment is the same as the multilayer printed board 10A of the above-described second embodiment.

The single-sided conductor pattern film 16B is manufactured in the following way. Here, the step illustrated in FIG. 7(A) is the same as the above-described step of FIG. 2(D) (and FIG. 5(D)) and is performed after the steps of FIGS. 2(A) to 2(C).

After the step of FIG. 7(A), on the entire surface of the conductor 14b, the plated layer 31a of Sn or Sn alloy is formed by electroplating or displacement plating (see FIG. 7(B)).

Next, the conductor 14b and the plated layer 31a are removed except in the land parts 15a of the filled through holes 15 as illustrated in FIG. 7(C).

Then, in the conductor 14 on one surface of the resin film 12 (conductor 14a), the conductor pattern 13 is formed (see FIG. 7(D)).

The single-sided conductor pattern film 16B is manufactured in this way and then, three (or plural) such single-sided conductor pattern films 16B are stacked in such a manner that their tops are oriented in the same way and the conductor pattern 13 and the land parts 15a of the filled through holes 15 are in contact between adjacent two single-sided conductor pattern films 16B. These stacked layers are subjected to batch heat fusion press to be superposed.

In this step, the resist film 42, the three single-sided conductor pattern films 16B and the resist film 41 are stacked in the order illustrated in FIG. 6 and these stacked layers are subjected to batch heat fusion press to be superposed. Then, the same multilayer printed board as the multilayer printed board 10A illustrated in FIG. 4 is achieved.

The thus structured third embodiment exerts the following effects as well as the above-described effects of the first and second embodiments.

Between two adjacent single-sided conductor pattern films 16B out of plural single-sided conductor pattern films 16B, opposed conductor pattern 13 and land parts 15a of filled through holes 15 are electrically connected to each other via conductive members (which are larger than the conductive member 30 illustrated in FIG. 4) formed by melting Sn of the plated layers 31a of Sn or Sn alloy. Therefore, the connection area becomes larger and the interlayer connection reliability is enhanced more.

(Forth Embodiment)

Figure 8:
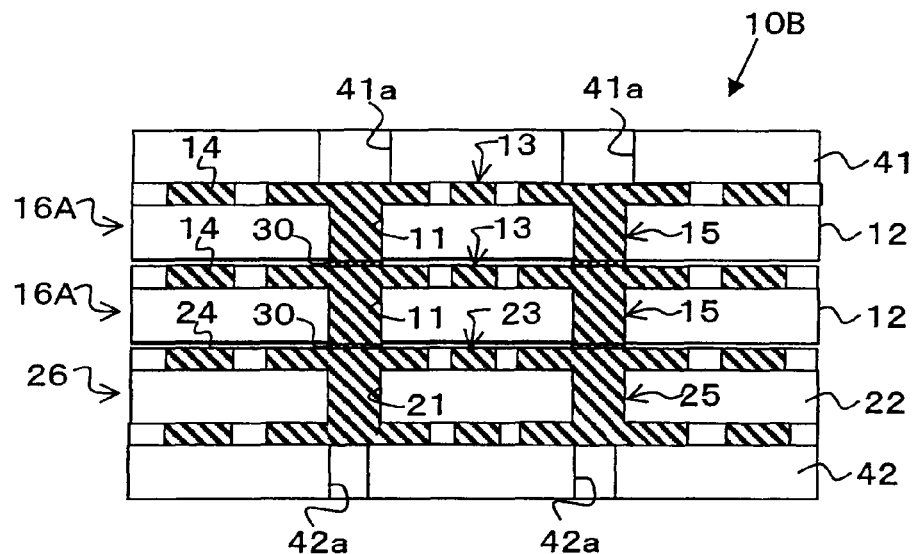
FIG. 8 is a cross sectional view illustrating an outline structure of a part of a multilayer printed board according to a third embodiment.
Figure 9:
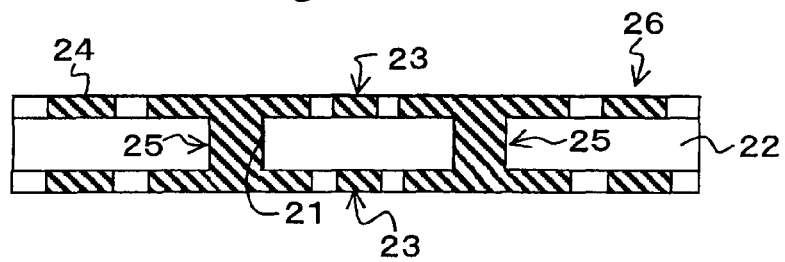
FIG. 9 is a cross sectional view illustrating a double-sided conductor pattern film used in a multilayer printed board according to a fourth embodiment.

Next description is made about a multilayer printed board according to the fourth embodiment, with reference to FIGS. 8 and 9. FIG. 8 is a cross sectional view illustrating an outline structure of a multilayer printed board 10B according to the fourth embodiment and FIG. 9 is a cross sectional view only illustrating a double-sided conductor pattern film 26 used in the multilayer printed board 10B.

The multilayer printed board according to the fourth embodiment is characterized in that, in the multilayer printed board 10 according to the above-described first embodiment, it has plural single-sided conductor pattern films 16A and one double-sided conductor pattern film 26.

This double-sided conductor pattern film 26 has, as illustrated in FIG. 9, conductor patterns 23 formed on both surfaces of a resin film 22 having through holes 21 and filled through holes 25 that are the through holes 21 filled with conductors 24 integrally with the conductor patterns 23.

Besides, this double-sided conductor pattern film 26 and the plural single-sided conductor pattern films 16A are stacked in such a manner that, as illustrated in FIG. 8, one of the conductor patterns 23 formed on the both surfaces thereof is electrically connected to filled through holes 15 of a single-sided conductor pattern film 16A placed at the outermost side of the plural single-sided conductor pattern films 16A.

The thus-structured fourth embodiment exerts the following effects as well as the above-mentioned effects of the first embodiment.

As the double-sided conductor pattern film 26 having conductor patterns 23 at both surfaces thereof are arranged at the outermost side, it can be easily connected electrically to an external device and the design flexibility is increased.

(Fifth Embodiment)

Figure 10:
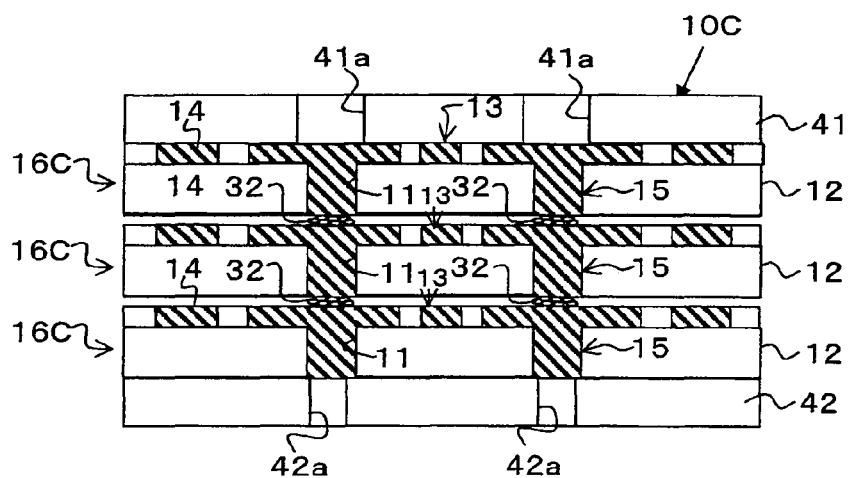
FIG. 10 is a cross sectional view illustrating an outline structure of a part of a multilayer printed board according to a fifth embodiment.
Figure 11:
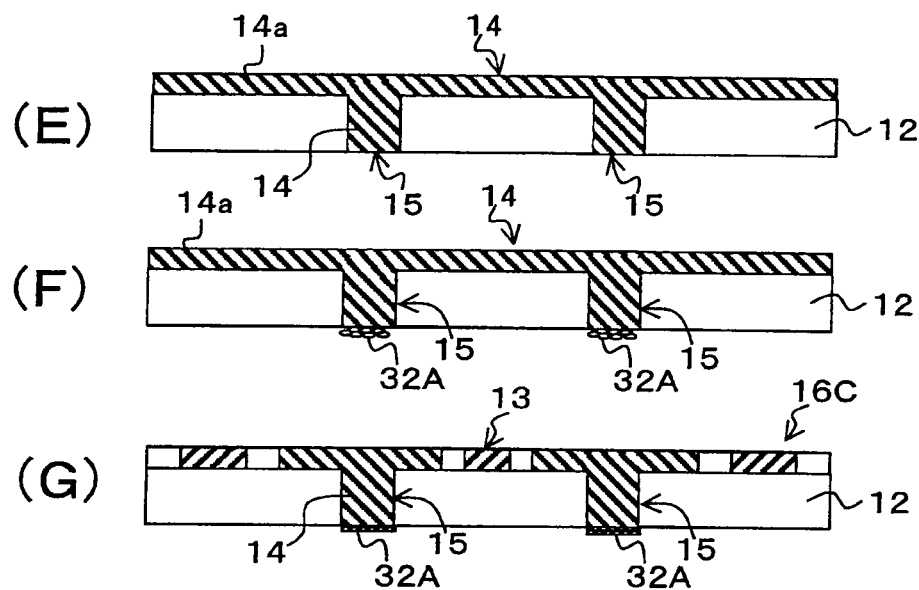
FIGS. 11(E) to 11(G) are process charts illustrating the process of manufacturing a single-side conductor pattern film used in the multilayer printed board according to the fifth embodiment.

Next description is made, with reference to FIGS. 10 and 11, about a multilayer printed board 100 according to the fifth embodiment of the present invention.

This multilayer printed board 100 is characterized by, as illustrated in FIG. 10, like in the above-described second embodiment illustrated in FIG. 4, including a conductive member 32 that is provided between a conductor pattern 13 and filled through holes 15 between adjacent two single-sided conductor pattern films 16C, 16C out of plural single-sided conductor pattern films 16C, the conductive member 32 being metal-to-metal connected to the filled through holes 15 and conductor pattern 13.

Besides, in the multilayer printed board 10A of the above-described second embodiment illustrated in FIG. 4, the conductive member 30 metal-to-metal connected to the conductor pattern 13 and the filled through holes 15 is such as obtained by melting Sn of the plated layer 30A of Sn or Sn alloy (see FIG. 5(F)).

On the other hand, in the multilayer printed board 100 according to the fifth embodiment, the conductive member 32 (see FIG. 10) metal-to-metal-connected to the conductor pattern 13 and the filled through holes 15 is formed of the conductor paste 32A (see FIG. 11(E)) hardening. With this structure, the opposing conductor pattern 13 and through holes 15 are mechanically bonded and electrically connected via the conductive member 32 between adjacent two single-sided conductor pattern films 16C, 16C. The other structure is the same as that of the multilayer printed board 10A of the fourth embodiment.

Next, a method for manufacturing of the multilayer printed board 10C is described based on FIGS. 11(F) to 11(G).

In the steps of this case, like the steps illustrated in FIGS. 5(A) to 5(E), after the above-described steps illustrated in FIGS. 2(A) to 2(E) are performed, the steps illustrated in FIGS. 5(F) and 5(G) are replaced with the following steps (3A) and (4A) illustrated in FIGS. 11(F) and 11(G).

(3A) A conductive paste 32A is interposed between the land part of each filled through hole 15 and the conductor pattern 13. In this example, the conductive paste 32 is applied onto the surface of the land part of each filled through hole 15 (see FIG. 11(F)).

(4A) In the next step, the plural single-sided conductor pattern films 16C are stacked with their tops oriented in the same way.

In this step, as is the case with the above-described second embodiment, the resist film 42, the single-sided conductor pattern films 160 and the resist film 41 are stacked in the order illustrated in FIG. 10 and these stacked layers are subjected to heat fusion press to be superposed. Then, the multilayer printed board 100 illustrated in FIG. 10 is achieved. Through heat fusion press, the conductive paste 32A provided between the land part of each of the filled through holes 15 and the conductor pattern 13 is hardened into a conductive member 32 (see FIG. 10) metal-to-metal connected to the filled through hole 15 and the conductor pattern 13.

In the thus-manufactured multilayer printed board 100, as the conductor patterns 13 of the three single-sided conductor pattern films 16C are interlayer-connected via the filled through holes 15 and the conductive members 32, the interlayer connection reliability is enhanced.

(Sixth Embodiment)

Figure 12:
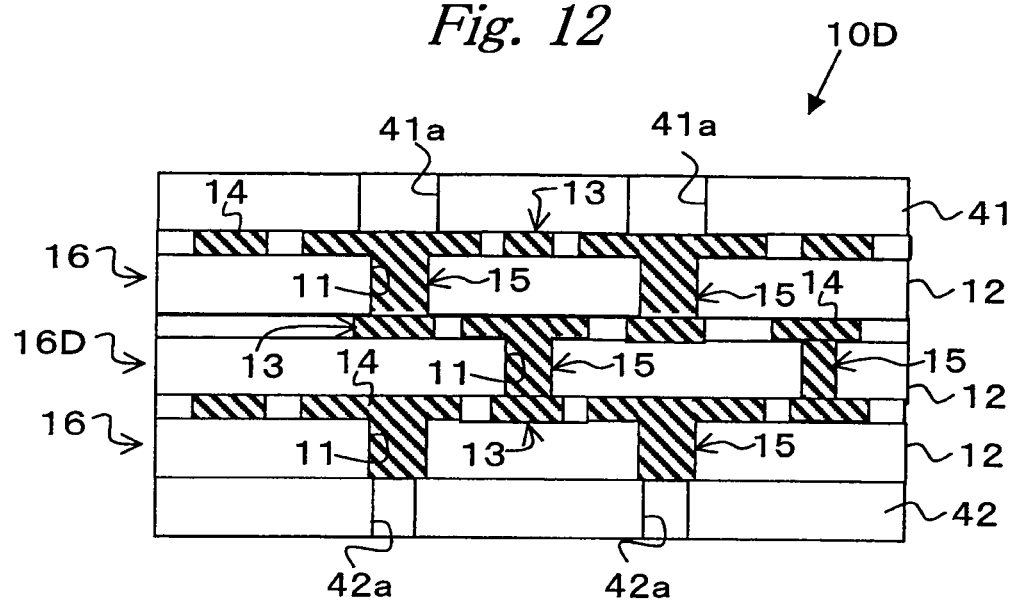
FIG. 12 is a cross sectional view illustrating an outline structure of a part of a multilayer printed board according to a sixth embodiment.

Next description is made, with reference to FIG. 12, about a multilayer printed board according to a sixth embodiment of the present invention.

Each of the above-described embodiments has been described by way of an example of the multilayer printed board with filled through holes of plural (three) single-sided conductor pattern films positioned coaxially. On the other hand, in the multilayer printed board 10D of this embodiment, as illustrated in FIG. 12, out of superposed plural (three in this example) single-sided conductor pattern films, the center axis of filled through holes 15 of two single-sided conductor pattern films at both sides is shifted from the center axis of filled through holes of a single-sided conductor pattern film 16D sandwiched between the single-sided conductor pattern films 16.

Then, in this multilayer printed board 10D, the filled through hole 15 of the single-sided conductor pattern film 16 at the resist film 41 side is connected electrically to the conductor pattern 13 of the single-sided conductor pattern film 16D, and the filled through hole 15 of the single-sided conductor pattern film 16 at the resist film 42 side is connected electrically to the conductor pattern 13 of the single-sided conductor pattern film 16D.

In the thus-structured multilayer printed board 10D, like in the multilayer printed board 10 illustrated in FIG. 1, as the conductor pattern 13 of the three single-sided conductor pattern films 16, 16D, 16 are interlayer-connected via the filled through holes 15 that are through holes 11 filled with the conductor integrally with the conductor patterns 13, the interlayer connection reliability is enhanced.

Next description is made about examples.

EXAMPLE 1

<Method for Manufacturing a Single-Sided Conductor Pattern Film 16A>

Hole Forming

As a resin film 12 of a single-sided conductor pattern film 16A, a liquid crystal polymer film (Vecstar (registered trademark) CT-50N, KURARAY CO., LTD.) having a thickness of 50 μm was used.

The carbon dioxide laser was used to form a through hole 11. The hole diameter is 40 micrometer. Here, the carbon dioxide laser used is LAVIA600TW made by Sumitomo Heavy Industries, Ltd. and energy is 10 J/cm$^2$, the number of shots is 2 and the frequency is 300 Hz.

The through hole 11 may be formed not only by the carbon dioxide laser, but also by UV-YAG laser or excimer laser when the hole has a smaller diameter. Besides, the through hole 11 may be formed by a mechanical drill.

Film Roughening: Desmear

A hole-formed resin film 12 was immersed in strong alkali to fuse the surface for roughening.

It was immersed in specified potassium hydroxid solution at the temperature of 80° C. and for 15 to 30 minutes thereby to make the surface rough. At the same time, the resin smear generated in forming of the through holes 11 are melt and removed and the surface of inner walls of the through holes 11 were also roughened.

Electroless plating was performed to plate the surface of each resin film 12 with Ni—P as base plating (base metal layer 17).

Conditioner treatment, electroless plating of Ni—P alloy, thermal treatment and electroplating of Cu were performed sequentially to manufacture a film metal laminated product.

Electroless Plating:

In the conditioner treatment, a conditioner of OPC-350 by OKUNO CHEMICAL INDUSTRIES CO., LTD. was used clean polymer film surfaces. Here, catalyst-imparting liquid containing palladium used here was OPC-80 catalyst by OKUNO CHEMICAL INDUSTRIES CO., LTD. and the activating agent used was an accelerator OPC-500.

In electroless plating of nickel alloy, nickel (Ni)-phosphorus (P) plating was performed on both surfaces of each resin film 12. The Ni—P plating liquid was selected from commercially available plating liquids having a phosphorus concentration of 5% or less. Chemical nickel EXC by OKUNO CHEMICAL INDUSTRIES CO., LTD. was used to form Ni plated layer at a thickness of 0.2 micrometers.

The plating liquid is not limited to this, but may be enplate Ni-426 by Meltex Inc. or Top Nicoron LPH-LF by OKUNO CHEMICAL INDUSTRIES CO., LTD.

In order to improve adhesion, thermal treatment may be performed before copper plating. Heating was performed at the temperatures of 230 to 250° C. for 30 seconds to 30 minutes. In this example, heating was performed at 240° C. and for three minutes.

Copper Electroplating

Further, copper electroplating was performed to form the conductor 14 at a thickness of 1 to 20 micrometers. In Cu electroplating, copper was formed to make the conductor 14 have a thickness of 5 micrometers. The copper electroplating liquid used was mentioned below. As an additive agent for through hole filling, CU-BRITE TFII by Ebara-Udylite Co., Ltd. was used.

Copper sulfate 120 g/L
Sulfuric acid 150 g/L
Concentrated hydrochloric acid 0.125 mL/L (as chlorine ion)

At this time, a current passing through one surface of the resin film 12 was differentiated from a current passing through the other surface so that the conductor 14a formed on the one surface (see FIG. 5(D)) had a thickness of 5 micrometers and the conductor 14b formed on the other surface had a thickness of 1 micrometer. Then, the inside of the through holes were simultaneously filled with copper.

In some cases, a resist film may be adhered to one surface of a resin film 12 where the conductor pattern 13 is not performed before copper electroplating to make conductive the surface where the conductor pattern 13 is formed and fill the through holes with copper. In this case, commercially available copper plating liquid for via filling may be used.

Removal of Conductor in Back Surface:

It is immersed in an etching liquid of iron chloride to remove the conductor 14b formed on the one surface of the resin film 12.

In some cases, the resist may be used to mask only the land parts of filled through holes 15 so that the conductor 14b formed on a single surface of the resin film 12 may be removed except at the land parts of filled through holes 15 (see FIG. 5(E)).

Manufacturing of Conductor Pattern 13:

A conductor pattern 13 on a single surface is such that a circuit was formed in the conductor 14 (conductor 14a) by the subtractive method. It was coated with a photosensitive resist, exposed to ultraviolet light and developed. Next, etching was performed to form the conductor pattern 13 and then, the resist was peeled off. Here, in order to form a finer circuit, the electric cupper plating thickness (conductor thickness) may be 2 to 3 micrometers and electric copper plating may be performed on the conductor pattern part after the plating resist was formed by the semi additive method.

SN Plating for Interlayer Connection:

Sn was performed on land parts of the filled through holes 15 in the surface with no conductor pattern 13 thereby to form a Sn plated layer 30A (see FIG. 5(F)). In order to keep Sn away from the conductor pattern 13 surface, a dry film is adhered to the conductor pattern surface 13 and the following plating liquid was used to perform electroplating.

In Sn electroplating, RONASTAN (Registered trademark) EC-J by Meltex Inc. was used as an additive agent.

Sn electroplating liquid
Tin(II) sulphate 40 g/L
Sulfuric acid 100 mL/L
Additive agent RONASTAN EC-J
Temperature 20° C.
Current density 2 A/dm$^2$ Here, it is not limited to Sn only, but may be Sn—Cu alloy plating (plated bath: Top Flead by OKUNO CHEMICAL INDUSTRIES CO., LTD. or the like), or Sn—Ag alloy plating.

Further, Sn plating method is not limited to electroplating, but may be displacement plating. It was immersed in the following plating liquid (any of the three liquids may be used) and a copper surface was displaced thereby to form Sn at 2 micrometers.

Displacement plating
Tin(II) chloride 18.8 g/L
Sodium cyanide 188 g/L
Sodium hydroxide 22.5 g/L
Temperature: ambient temperatures
Sodium stannate 60 g/L
Sodium cyanide 120 g/L
Sodium hydroxide 7.5 g/L
Temperature 21~65° C.
Tin(II) chloride 6 g/L
Thiourea 55 g/L
Tartaric acid 39 g/L
Temperature 12~14° C.

<Method for Manufacturing a Multilayer Printed Board 10A>

A plurality of single-sided conductor pattern films 16A were stacked and subjected to heat fusion press at the press temperature of 232 to 350° C. and pressure of 0.5 to 10 Mpa. If the conductor pattern films were all films with conductor patterns on single surface thereof (single-sided conductor pattern films 16A), as illustrated in FIG. 4, the resist film 42 with through holes 42a formed therein and films with vias formed from back surfaces thereof were used.

Here, all of the conductor pattern films are not necessarily single-sided conductor pattern films 16A, but may include double-sided conductor pattern films 26 having an outermost layer with conductor patterns 23 on both surfaces thereof and filled through holes 25 like in the multilayer printed board 10B according to the fourth embodiment (see FIG. 8).

EXAMPLE 2, 3

In the example 2, the film base material used is a liquid crystal polymer film having a thickness of 50 μm (Vecstar (Registered trademark) CT-50N by KURARAY CO., LTD.)

In the example 3, the film base material used is PEEK/PEI having a thickness of 50 μm (IBUKI (Registered trademark) by Mitsubishi Plastics, Inc.)

EXAMPLE 4 to 9

In the examples 4 to 9, multilayer printed boards 100 (see FIG. 10) were manufactured with the press conditions and the resin films shown in Table 1.

In the examples 4 to 6, connection between opposing filled through holes 15 and conductor pattern 13 between the adjacent two single-sided conductor pattern films 16C was performed with use of Ag paste as the conductive paste 32A.

In the examples 4 to 6, the conductive paste 32a was applied by screen printing and cured by heat fusion press. The conductor 32 (see FIG. 10) with the conductive paste 32A cured was used to metal-to-metal connect the opposing filled through holes 15 and conductor pattern 13 between adjacent two single-sided conductor pattern films 16C. Ag of the conductive paste 32A used is DOTITE XA-824 by FUJIKURAKASEI CO., LTD. Heat fusion was performed on the press conditions and temperatures shown in Table 1.

In the examples 7 to 9, connection between opposing filled through holes 15 and conductor pattern 13 between the adjacent two single-sided conductor pattern films 16C was performed with use of AgSn paste as the conductive paste 32A. The details of the paste used are disclosed in Japanese Patent No. 3473601, paragraph 0075.

In the examples 4, 5, 7 and 8, the same film base material as that in the example 2 was used.

In the examples 6 and 9, the same film base material as that in the example 3 was used.

Here, in the examples 2 to 9. The multilayer printed board was manufactured in the same way as that of the example 1, and the pressure and the temperature were those shown in the conditions of Table 1.

Table 1 shows conditions and results of the examples 1 to 9.

COMPARATIVE EXAMPLES

As comparative examples, a single-sided laminated sheet and a double-sided laminated plate having a copper foil and a film bonded thereto were used and for interlayer connection, a multilayer board was manufactured by filling blind via holes formed in the film with a conductive paste and subjecting the film to heat fusion press.

In these comparative examples, a copper bonded laminated sheet obtained by heat fusion of the copper foil and film was used to form a conductor pattern by etching. Vias were formed by a laser.

A conductive paste was applied to the vias in the film by screen printing.

Layers on which films filled with the conductive pastes were bonded were stacked and subjected to batch heat fusion press. The press temperature ranged from 230 to 350° C. and the pressure ranged from 0.15 to 10 MPa. In this press, the films were bonded on each other and the conductive paste filled in the vias of the films were cured and electrically connected to the conductor pattern of the films. Ag of the conductive paste used is DOTITE XA-824 by FUJIKURAKASEI CO., LTD. The conductive paste used is AgSn. The details of the paste used are disclosed in Japanese Patent No. 03473601, paragraph 0075.

Conditions and results of comparative examples are shown in Table 2.

TABLE 1

| | Film base material | Product name | Conductor between films | Pressure MPa | Press tempearture ° C. | Thickness variation % | Through hole reliability test cycles |
|---|---|---|---|---|---|---|---|
| Example 1 | liquid crystalline polymer | Vecstar CT | Sn plating 2 micrometers | 1 | 280 | 0.3 | 5300 |
| Example 2 | liquid crystalline polymer | BIAC BC | | 1.5 | 320 | 0.2 | 9400 |
| Example 3 | PEEK/PEI | IBUKI | | 2.5 | 240 | 0.2 | 4800 |
| Example 4 | liquid crystalline polymer | Vecstar CT | Ag paste | 1 | 280 | 0.5 | 4500 |
| Example 5 | liquid crystalline polymer | BIAC BC | | 1.5 | 320 | 0.4 | 7000 |
| Example 6 | PEEK/PEI | IBUKI | | 2.5 | 240 | 0.3 | 4200 |
| Example 7 | liquid crystalline polymer | Vecstar CT | Ag—Sn paste | 1 | 280 | 0.5 | 4900 |
| Example 8 | liquid crystalline polymer | BIAC BC | | 1.5 | 320 | 0.4 | 8300 |
| Example 9 | PEEK/PEI | IBUKI | | 2.5 | 240 | 0.4 | 4900 |

TABLE 2

| | Film base material | Product name | Conductor between films | Pressure MPa | Press tempearture ° C. | Thickness variation % | Through hole reliability test cycles |
|---|---|---|---|---|---|---|---|
| Comparative Example 1 | liquid crystalline polymer | Vecstar CT | Ag paste | 1 | 280 | 8.5 | 800 |
| Comparative Example 2 | liquid crystalline polymer | BIAC BC | | 1.5 | 320 | 9.2 | 650 |
| Comparative Example 3 | PEEK/PEI | IBUKI | | 2.5 | 240 | 5.9 | 350 |
| Comparative Example 4 | liquid crystalline polymer | Vecstar CT | Ag—Sn paste | 1 | 280 | 15.7 | 980 |
| Comparative Example 5 | liquid crystalline polymer | BIAC BC | | 1.5 | 320 | 18.4 | 1200 |
| Comparative Example 6 | PEEK/PEI | IBUKI | | 2.5 | 240 | 12.2 | 760 |

Comparison of Connection Reliability

A six-layer board having conductor patterns in conformance with L in Figure 2.1 of JIS C 5012 was manufactured. The hole diameter of interlayer connected parts was 40 micrometers, the land part diameter was 0.5 mm, the wire width was 0.3 mm and the distance between through holes 11 was 7.62 mm. In the comparative examples, a via having a diameter of 100 micrometers was formed at each of the through holes like in the present invention, and was filled with a conductive paste.

In the present invention, a temperature cycle test meeting the conditions defined in JIS C 5012 9.1.3 was carried out to examine the interlayer connection reliability. Poor connection was determined when a resistance value is increased 20% or more relative to the initial resistance.

Seeing from the examples 1 to 9 shown in Table 1 and comparative examples 1 to 6 shown in Table 2, the examples 1 to 9 produce the following effects.

Press thickness change after fusion press is small.

Connection reliability of through holes is high.

Here, this invention may be embodied the following modified forms.

In each of the above-described embodiments, the number of stacked resin films 12 is not limited to "three". The present invention is applicable to a wide range of multilayer printed boards having plural stacked resin films 12.

In the above-described second embodiment, the plated layer 30A of Sn or Sn alloy may not be formed on the land part surfaces of each single-sided conductor pattern film 16A, but may be formed a part of the surface of the conductor pattern 13 opposing to the land part surfaces. The present invention is applicable to a multilayer printed board having such a structure.

The invention claimed is:

1. A multilayer printed board comprising:
a plurality of single-sided conductor pattern films, each of the single-sided conductor pattern films having a conductor pattern formed on one surface of a resin film having a through hole and a filled through hole that is the through hole filled with a conductor integrally with the conductor pattern, the single-sided conductor pattern films being stacked one on another in such a manner that respective tops of the single-sided conductor pattern films are oriented in a same manner, and conductor patterns of the single-sided conductor pattern films being electrically connected to each other via filled through holes; and
a conductive member provided between the conductor pattern and the filled through hole that oppose between each adjacent two of the single-sided conductor pattern films, the conductive member being metal-to-metal connected to the conductor pattern and the filled through hole, wherein
the conductor pattern and the filled through hole have a base metal layer and a conductor formed on the base metal layer, the conductor pattern being formed in the conductor,
the base metal layer is made of Ni-P alloy containing P at 2 to 6% and having a thickness of 0.05 to 0.5 micrometers, and the conductor is made of Cu, and
the base metal layer is formed of plated Ni-P alloy that is heated at a temperature in a range of 230 to 250° C. for 30 seconds to 30 minutes.

2. The multilayer printed board of claim 1, wherein the conductive member is metal containing Sn.

3. The multilayer printed board of claim 1, wherein the metal containing Sn contains, in addition to Sn, at least one of Ag, Cu, Zn and Bi.

4. The multilayer printed board of claim 1, wherein a land part of each of the filled through holes is enlarged.

5. The multilayer printed board of claim 1, further comprising a double-sided conductor pattern film having conductor patterns formed on both surfaces, respectively, of a resin film having a through hole and a filled through hole that is the through hole filled with a conductor integrally with the conductor patterns, the double-sided conductor pattern film being stacked on an outermost one of the single-sided conductor pattern films, one of the conductor patterns of the double-sided conductor pattern film is electrically connected to the filled through hole of the outermost single-sided conductor pattern film directly or via the conductive member metal-to-metal connected to one of the conductor patterns and the filled through hole.

6. The multilayer printed board of claim 1, wherein the resin film is a thermoplastic resin having a glass transition point and a fusing point between or equal to 150 and 350° C.

7. The multilayer printed board of claims 1, wherein the resin film is a film of which crystal is optically anisotropic.

8. The multilayer printed board of claims 1, wherein the resin film comprises polyaryl ketone and amorphous polyetherimide.

* * * * *